United States Patent [19]
Martin et al.

[11] Patent Number: 5,660,270
[45] Date of Patent: Aug. 26, 1997

[54] ELECTRICAL SWITCH HAVING AN INTERNAL LIGHTING CIRCUIT

[75] Inventors: Elmer W. Martin; Peter J. Banks, both of Valparaiso, Ind.; David R. Ganser, El Paso, Tex.; John A. Stuhlmacher, Crown Point, Ind.

[73] Assignee: McGill Manufacturing Company, Valparaiso, Ind.

[21] Appl. No.: 618,930

[22] Filed: Mar. 20, 1996

[51] Int. Cl.⁶ .................................................. H01H 9/00
[52] U.S. Cl. ..................... 200/315; 200/292; 200/302.3; 200/558
[58] Field of Search ........................... 200/315, 310, 200/313, 339, 553, 558, 292, 302.3

[56] References Cited

U.S. PATENT DOCUMENTS

| | | | |
|---|---|---|---|
| 2,878,346 | 3/1959 | Andrews et al. | 200/315 |
| 4,013,857 | 3/1977 | Tanaka | 200/315 |
| 4,268,734 | 5/1981 | Sorenson | 200/315 |
| 5,107,082 | 4/1992 | Valenzona | 200/315 |
| 5,290,983 | 3/1994 | Roberts et al. | 200/292 |

*Primary Examiner*—David J. Walczak
*Attorney, Agent, or Firm*—Leydig, Voit & Mayer, Ltd.

[57] ABSTRACT

An electrical switch having an internal lighting circuit which does not interfere with the movements of the internal components of the switch. The lighting circuit of the electrical switch employs a circuit board for connecting one or more lamps to electrical contacts disposed on a wall of the switch housing thereby avoiding the manufacturing problems and expenses associated with employing the extended lead wires found in prior art switches.

25 Claims, 4 Drawing Sheets

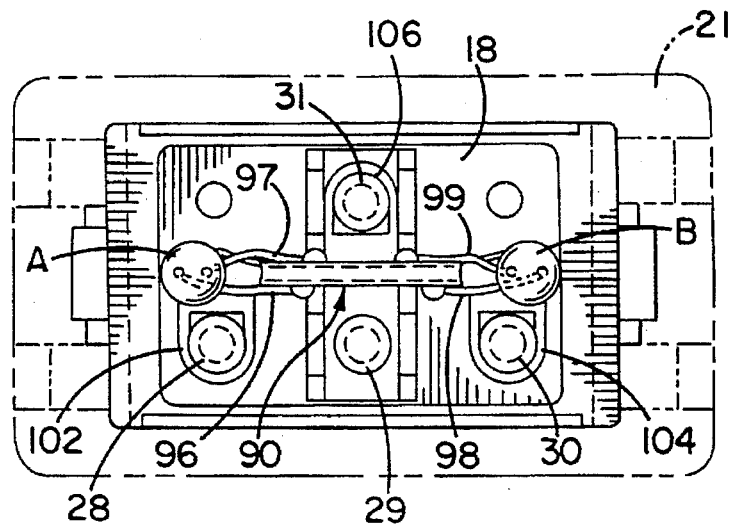
FIG. 4
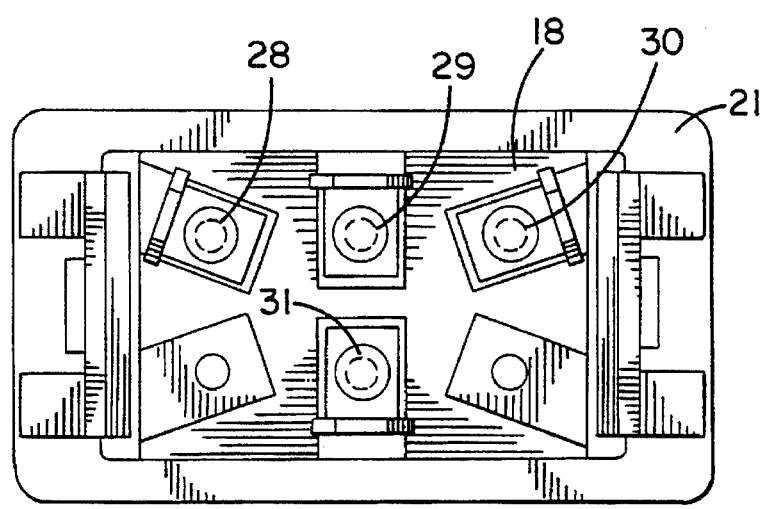
FIG. 5
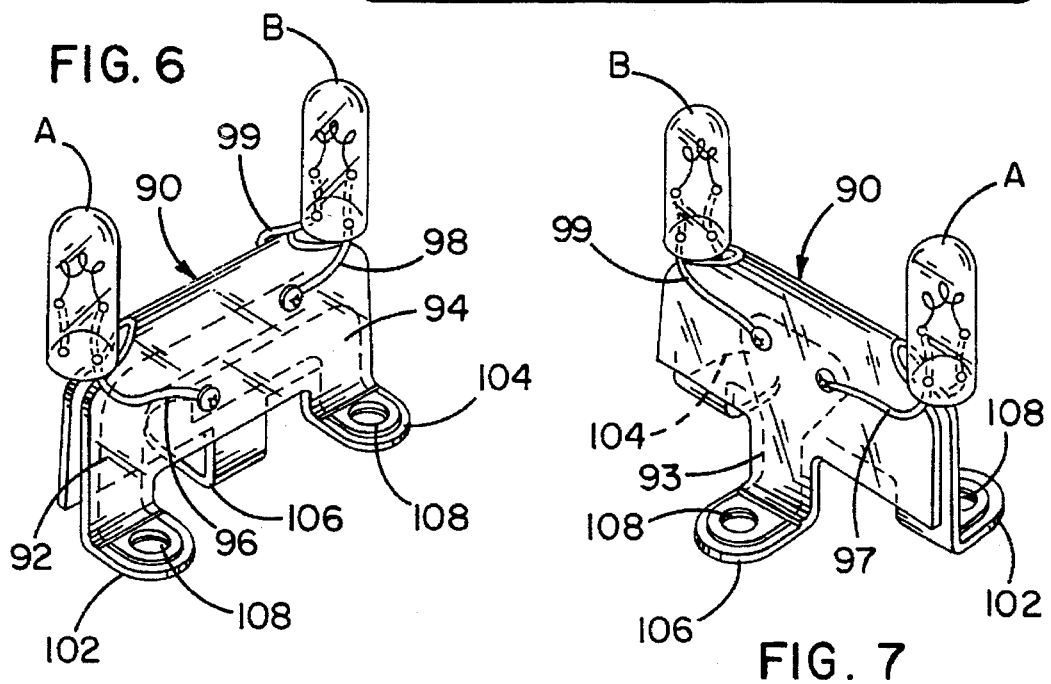
FIG. 6
FIG. 7

5,660,270

ELECTRICAL SWITCH HAVING AN INTERNAL LIGHTING CIRCUIT

FIELD OF THE INVENTION

The present invention relates generally to electrical switches, and more particularly, to self-illuminated electrical switches having internal lighting circuits.

BACKGROUND OF THE INVENTION

Selectively operable electrical switches have long been utilized for actuating electrical devices. In the past, these switches have sometimes been provided with internal lighting circuits which illuminate the switch or portions thereof to achieve certain purposes. For example, such lighting circuits have been used to provide general illumination of a switch to facilitate use in an otherwise dark environment. Lighting circuits have also been employed to provide a visual indication that the switch illuminated by the circuit is currently being supplied with power. In addition, lighting circuits have also been constructed to indicate the operating state or operating position of the switch itself. For example, switches have been designed to include a lamp which only illuminates when the switch is in the "on state" (i.e., flowing current to a connected device) to enable a user to readily determine whether that switch has been thrown. An exemplary lighted switch that employs lamps for both general illumination and to provide an indication of the operating state of the switch is described in detail in commonly assigned U.S. Pat. No. 4,667,073, which is hereby incorporated by reference.

Prior art self-illuminated or lighted switches have generally suffered from certain disadvantages. For example, prior art lighting circuits have typically employed thin lead wires to couple one or more lamps in circuit with one or more contacts on the floor of the switch housing. Since it is generally preferable to position the lamps near the top of the switch housing to improve the illumination of the switch bat or button, the lead wires usually extend a distance from the bottom of the switch housing to a position near the top of the switch housing. Thus, in order to avoid interference between the moving components of the switch and the lead wires, trained personnel must carefully form and position the lead wires by hand during the manufacturing process of such lighted switches. As a result, the manufacturing process of prior art self-illuminated switches has typically been labor intensive, time consuming and expensive.

In addition, due to the limited cavity space typically available in self-illuminated switches, it has often been necessary to add external electrical jumpers to the switch housing in order to provide the necessary lamp connections without interfering with the moving components of the switch. The provision of such external jumpers has added component costs and additional construction steps to the manufacturing process of prior art self-illuminating switches thereby further increasing the overall cost to manufacture these devices.

OBJECTS AND SUMMARY OF THE INVENTION

It is an object of the present invention to provide an improved self-illuminated switch having an internal lighting circuit which does not interfere with the moving components of the switch.

It is a further object to provide a self-illuminated switch of the foregoing type that can be cost-effectively manufactured. It is a related object to provide a lighted switch that can be manufactured simply and efficiently without requiring highly skilled personnel to assemble the switch.

It is another object of the invention to provide an improved self-illuminated switch that permits the use of shorter lamp wires in the lighting circuit and hence minimizes the risk of interference between the lamp wires and the mechanical components of the switch.

It is another object to provide a self-illuminated switch which avoids the use of external jumpers.

Other objects and advantages of the invention will become apparent upon reading the following detailed description and upon reference to the drawings, in which:

BRIEF DESCRIPTION OF THE DRAWINGS

FIG. 4 is a cross-sectional view of the switch taken along lines 4—4 of FIG. 2.

FIG. 5 is a bottom plan view of the switch viewed along lines 5—5 of FIG. 2.

FIG. 6 is a right perspective view of an exemplary circuit board for use in the switch of FIG. 1.

FIG. 7 is a left perspective view of the circuit board shown in FIG. 6.

Figure 1:
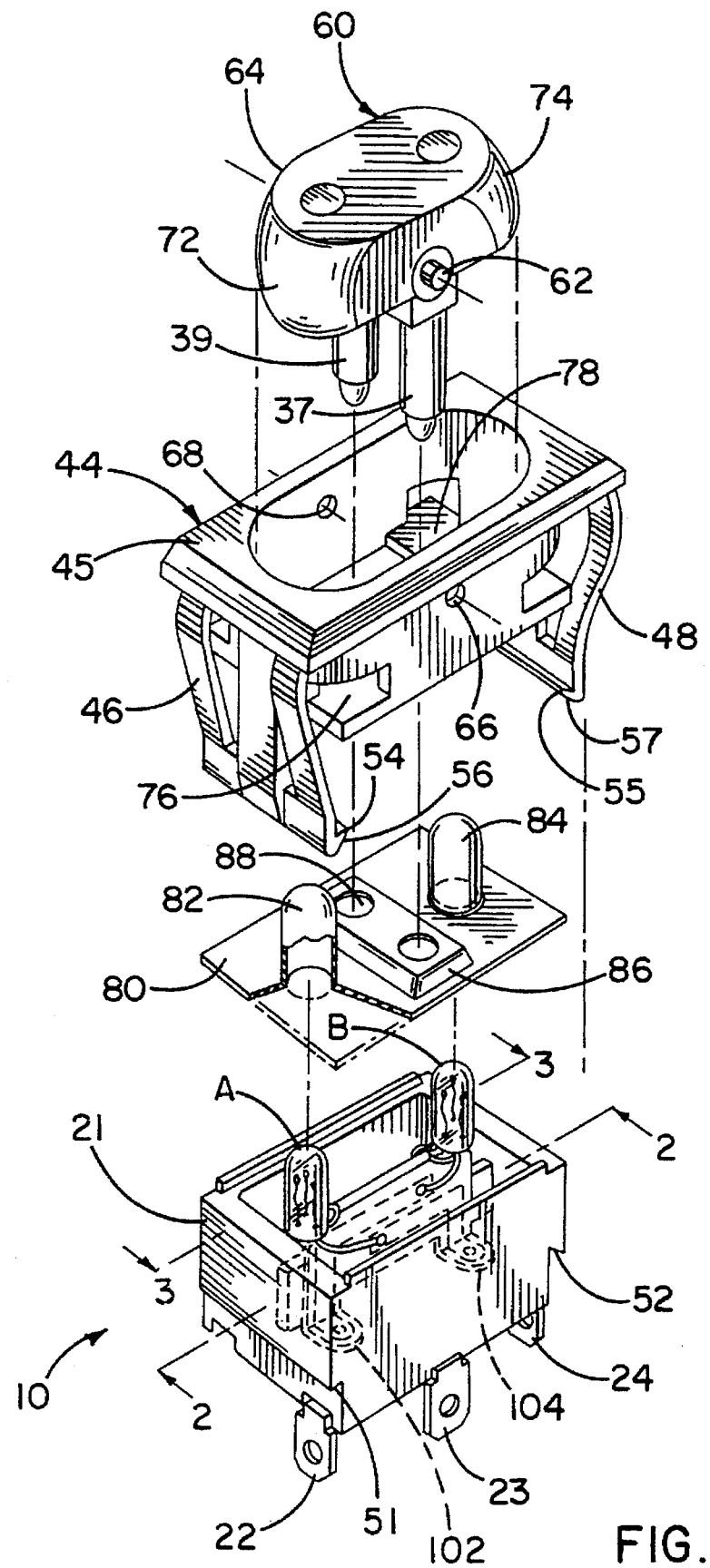
FIG. 1 is an exploded perspective view of a lighted switch constructed in accordance with the teachings of the instant invention.

While the invention is susceptible of various modifications and alternative constructions, a certain illustrated embodiment thereof has been shown in the drawings and will be described below in detail. It should be understood, however, that there is no intention to limit the invention to the specific form disclosed, but on the contrary, the intention is to cover all modifications, alternative constructions and equivalents falling within the spirit and scope of the invention.

DETAILED DESCRIPTION OF A PREFERRED EMBODIMENT

Referring now more particularly to FIG. 1 of the drawings, there is shown an illustrative electrical switch 10 constructed in accordance with the teachings of the present invention. The general type of switch employed in the instant invention is described in the aforesaid commonly assigned U.S. Pat. No. 4,667,073. Accordingly, while the construction and operation of an exemplary switch housing and mechanism will be discussed generally herein, further details regarding switch mechanisms and lighted switch constructions with which the present invention can be used are set forth in the referenced patent and will not be repeated here. It will, however, be understood that the present invention is in no way limited to use with a specific switch or switch mechanism. On the contrary, the instant invention can be employed with any switch configuration which would benefit from including an internal lighting circuit.

Figure 2:
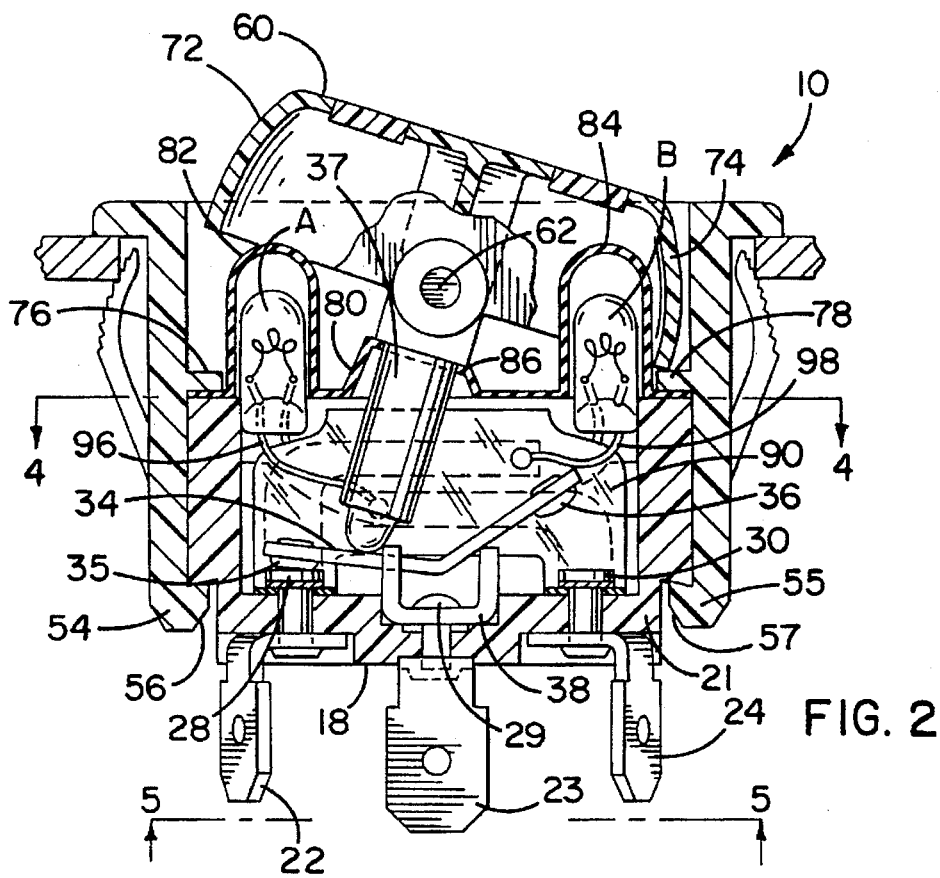
FIG. 2 is an enlarged cross-sectional view of the lighted switch taken along lines 2—2 of FIG. 1.
Figure 3:
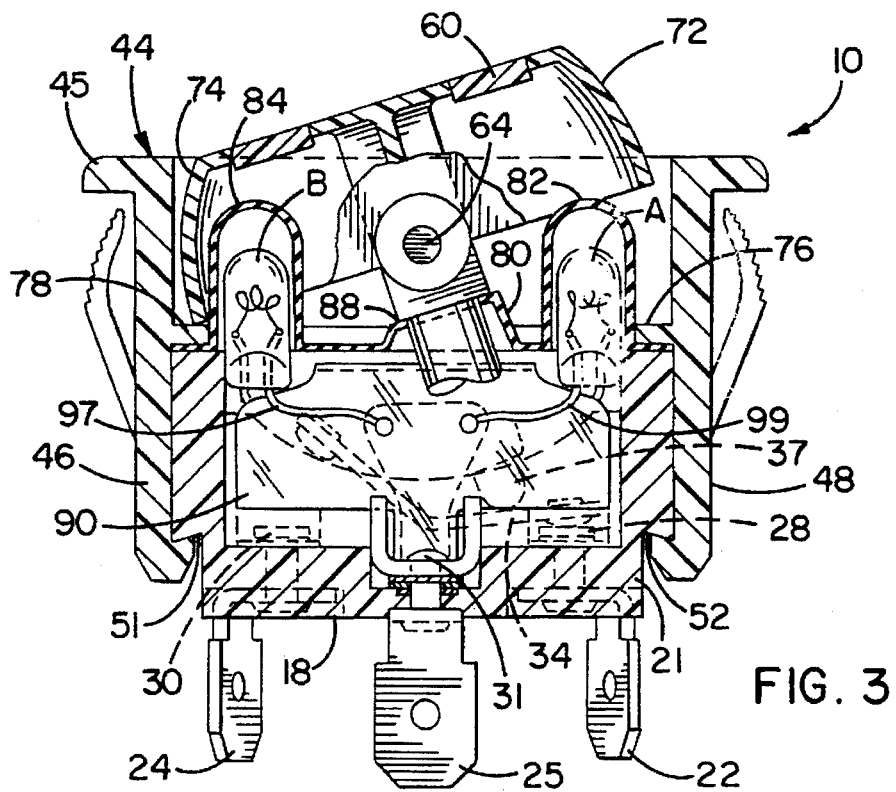
FIG. 3 is an enlarged cross-sectional view of the lighted switch taken along lines 3—3 of FIG. 1.

The exemplary switch 10 illustrated in FIGS. 1-3 includes a box-like housing 21 having a plurality of plug-in terminals 22, 23, 24, 25 projecting outwardly from a bottom wall 18 of the housing 21. The terminals 22–25 are respectively connected to conductive rivets 28, 29, 30, 31 which are situated on the upper face of the bottom wall 18 of the housing 21 as shown in FIGS. 4 and 5. As explained in further detail below, in the illustrated embodiment the rivets 28–31 form electrical contacts which are employed in the operation of the switch 10 and/or the internal lighting circuit. In this case, rivets 28 and 30 are specifically employed as switch contacts.

In order to provide a means for selectively closing an electrically conductive path through the switch 10, a conductive bridge 34 having a pair of contacts 35, 36 adjacent the opposite ends thereof is rockably mounted on a bridge support 38 situated midway between the contacts 28, 30 on the bottom wall 18 of the housing 21. This arrangement permits the bridge 34 to be rocked by a toggle lever or bat 37 so as to selectively engage either its contact 35 with the contact 28, or its contact 36 with the contact 30 on the bottom wall 18 of the housing 21.

A housing cover 44 having the general shape of an inverted "U" is provided as a top closure for the housing 21. The cover 44 comprises a generally rectangular central panel 45 having a pair of side panels 46, 48 depending from the ends thereof. The panels 46, 48, while integrally connected with the central panel 45, are sufficiently resilient to permit their being spread apart to permit assembly of the housing cover 44 upon the housing 21.

In order to retain the cover 44 on the housing 21, the latter is formed with undercut grooves 51, 52 in the lower portion of its end walls. The side panels 46, 48 of the cover 44 are correspondingly provided with a pair of locking shoulders 54, 55 at their lower ends. For ease of assembly, the inside lower end portions of the shoulders 54, 55 are formed with chamfers 56, 57. By reason of the foregoing construction, it will be appreciated that the housing cover 44 may be readily slid onto the housing and pressed downwardly until the shoulders 54, 55 interlock with the undercut grooves 51, 52 in the ends of the housing 21.

In order to facilitate user operation of the switch 10, the illustrated switch 10 is provided with a manually engageable button 60 which is pivotably supported within the housing 21. Although other button configurations are likewise appropriate, in the illustrated embodiment the button 60 includes oppositely disposed cylindrical lugs 62, 64 which mate with oppositely disposed bores 66, 68 defined in the housing cover 44. The interaction of these lugs 62, 64 and bores 66, 68 permits a user to rock the button 60 between two extreme positions by applying appropriate pressure to the upper surface of the button 60. For example, one of the two extreme positions is illustrated in FIGS. 2 and 3. The other extreme position occurs when the button 60 is pivoted to the side opposite that shown in FIGS. 2 and 3 (i.e., with the toggle lever 37 pivoted towards the right in FIG. 2). In the illustrated embodiment, a user can also position the button 60 in an intermediate position (not shown) wherein the upper surface of the button 60 is positioned in a plane substantially parallel to the floor 18 of the housing 21 and the contacts 35, 36 of the conductive bridge 34 are both separated a distance from their corresponding switch contact 28, 30.

To translate movements of the manually engageable button 60 into changes in the electrical condition of the switch 10, the button 60 is integrally formed with the toggle lever 37. As explained above, this toggle lever 37 is operably connected to the conductive bridge 34 such that, as the button is pivoted in one direction, the toggle lever 37 rocks the conductive bridge 34 in the opposite direction. Thus, when the button 60 is suitably depressed in a given direction, the conductive bridge 34 will rock in the opposite direction until one of its contacts 35, 36 engages its respective contact 28, 30 on the housing floor 18. In the illustrated embodiment, moving the conductive bridge 34 in this manner creates a conductive path between the bridge support 38 and whichever one of the switch contacts 28, 30 the bridge 34 abuts. The illustrated switch is, thus, of the double throw type. Those skilled in the art will, however, appreciate that other switch configurations could be employed without departing from the scope or the spirit of the invention. For example, the switch 10 could be configured with only one of the rivets 28, 30 such that pivoting the conductive bridge 34 would only close an electrical path in one of the two fully pivoted positions.

In order to limit the pivoting motion of the button 60, the button 60 is provided with downwardly extending oppositely disposed walls 72, 74 and the housing cover 44 is provided with inwardly directed, oppositely disposed shoulders 76, 78. Each of the shoulders 76, 78 of the housing cover 44 are positioned to abut the lower edge of one of the oppositely disposed walls 72, 74 of the button 60 when the button 60 is pivoted a pre-determined distance. In the illustrated embodiment, the shoulders 76, 78 and walls 72, 74 are arranged to permit the button 60 to toggle the conductive bridge 34 into contact with either of the switch contacts 28, 30.

Although the illustrated switch 10 is of a single pole, double throw type, those skilled in the art will appreciate that the present invention is equally applicable to other types of switches including double pole, double throw type switches. Indeed, the illustrated embodiment includes a second toggle lever 39, and could, thus, be readily adapted into a double pole type switch.

For indicating the operating state of the switch 10, the illustrated switch 10 is provided with two self contained indicator lamps A, B. Each lamp A, B may, for example, be a miniature type lamp rated at 14 volts and 0.08 amperes with an average life of 50,000 hours. As explained in detail below, each lamp A, B is connected to a power source so as to light selectively depending upon the position of the toggle lever 37. Thus, when the lever 37 is in the position shown in FIGS. 2 and 3, lamp B is energized. On the other hand, lamp A is energized when the lever 37 is in the position opposite that shown in FIGS. 2 and 3. When the lever 37 is in its centered or neutral position (not shown), neither lamp is energized.

To protect the lamps A, B and also to maintain their position within the switch 10, the switch 10 is provided with a template 80 having pre-formed lenses 82, 84 for receiving the lamps A, B. Although the lenses 82, 84 may be color coded if desired, in the illustrated embodiment the template 80 has a white or neutral color such that, with the exception of its position, each lamp A, B appears the same as the other when lighted.

The template 80 is further provided with two bores or apertures 86, 88 to receive the toggle levers 37, 39. In order to insure the template 80 does not interfere with the pivoting movements of the button 60 and its associated levers 37, 39, at least the area of the template 80 surrounding the apertures 86, 88 should be flexible. In the illustrated embodiment the template 80 is constructed from a pliable rubber and will, thus, flex with the movements of the toggle levers 37, 39 as shown in FIGS. 2 and 3.

In accordance with an important aspect of the invention, the lighting circuit of the inventive switch employs a printed circuit board to substantially reduce the length of the lead wires required to implement the circuit. More specifically, the inventive switch employs a substantially vertically disposed printed circuit board to connect the electrical contacts disposed on the bottom of the housing to the lamps disposed near the top of the housing to substantially shorten the lengths of the lead wires used in the lighting circuit and to greatly reduce the risk of interference between the components of the lighting circuit and the mechanical components of the switch.

To this end, in the illustrated embodiment, the lamps A, B are connected to the power source via conductive paths 92, 94 formed on a flexible circuit board 90. Preferably, the circuit board 90 is disposed in a substantially vertical plane perpendicular to the bottom wall 18 of the housing 21 with the lamps A, B connected to the circuit board 90 near the top of the switch housing 21. Positioning the lamps A, B near the top of the housing 21 in this manner ensures that neither the lamps A, B nor their lead wires 96, 97, 98, 99 interfere with the movements of the toggle levers 37, 39. Moreover, in the illustrated embodiment, the circuit board 90 is disposed in the center of the switch housing 21 such that the toggle levers 37, 39 can freely pivot in a plane parallel to the circuit board 90 Without encountering any interference from the circuit board 90 or any other component of the lighting circuit.

It should be noted that for purposes of this application the term "circuit board" is defined to include any circuit printed on a substrate, whether the substrate is flexible or solid, and whether the substrate is constructed from one piece or from several separate components. Thus, although the preferred embodiment employs a flexible circuit board (constructed of pliable plastic in a manner well known in the art), those skilled in the art will appreciate that a rigid circuit board could likewise be employed without departing from the scope or the spirit of the invention.

In order to secure the circuit board 90 within the switch housing 21, the circuit board 90 is provided with integral tabs 102, 104, 106. Each of these tabs 102, 104, 106 includes a substantially circular bore 108 sized to receive one of the conductive rivets 28–31. As a result, the circuit board 90 can be secured to the bottom wall 18 of the housing 21 by positioning a tab adjacent the wall 18 and fastening one of the rivets 28–31 through the bore 108, the wall 18, and one of the terminals 22–25. Once the tabs 102, 104, 106 are secured to the housing 21 in this fashion, the tabs 102, 104, 106 are disposed in a plane substantially parallel to the wall 18 and substantially perpendicular to the rest of the circuit board 90.

Figure 8:
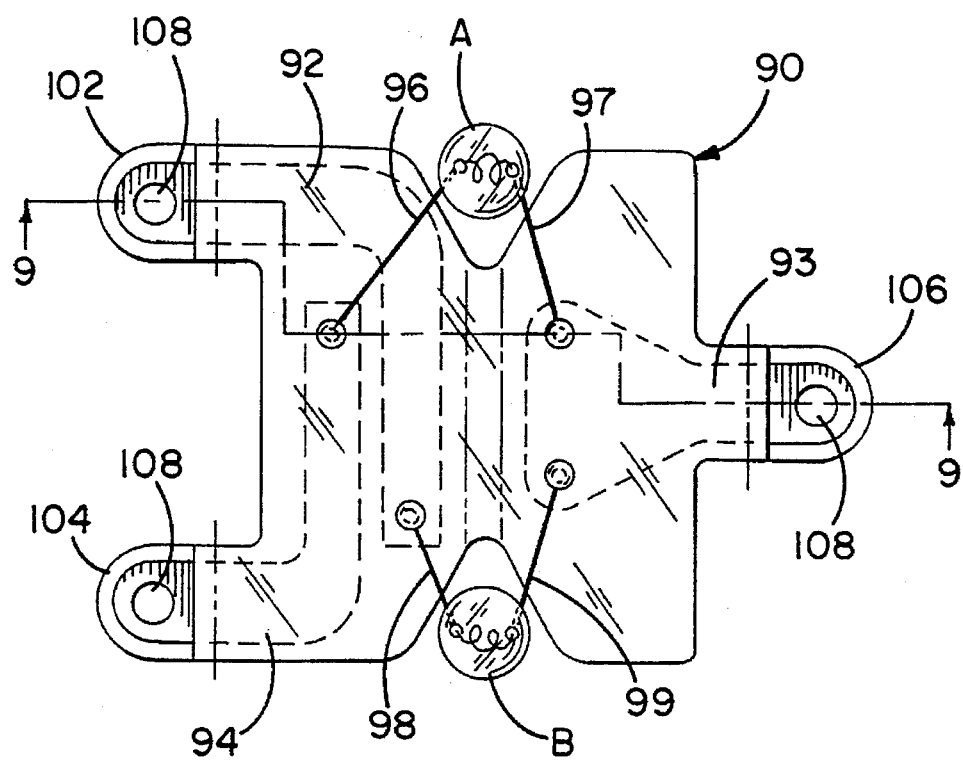
FIG. 8 is a plan view of the circuit board of FIGS. 6 and 7 but illustrating the board in a prone position.
Figure 9:
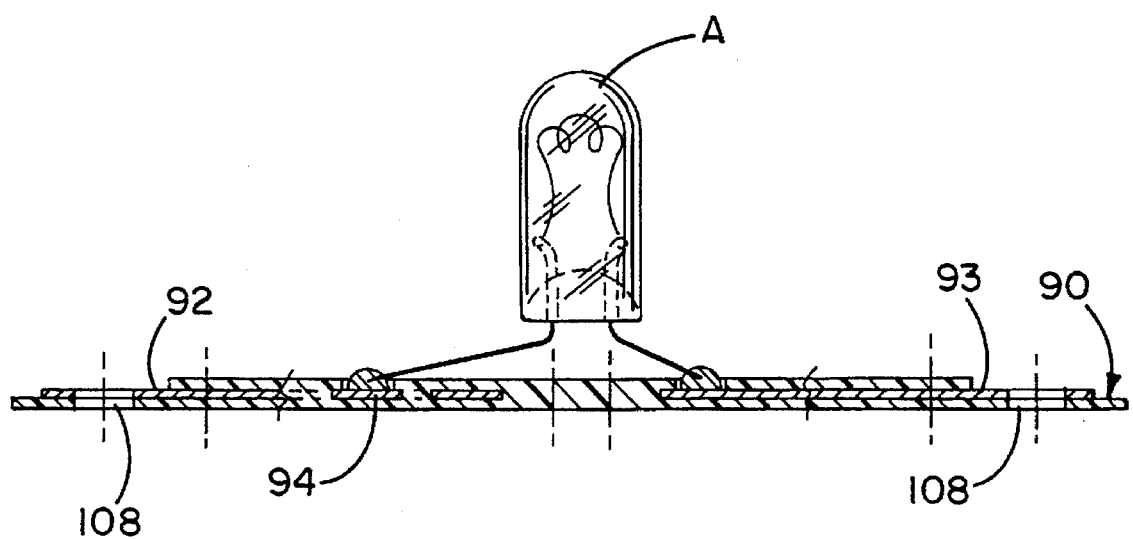
FIG. 9 is an enlarged cross-sectional view of the circuit board taken substantially along lines 9—9 of FIG. 8.

To provide stability, the tabs 102, 104, 106 are preferably arranged with one tab 106 centrally disposed on one side of the circuit board 90 and the other two tabs disposed at the corners on the opposite side of the circuit board 90 as shown in FIGS. 6–8. Further stability is provided in the illustrated embodiment by securing the flexible circuit board 90 to the housing 21 with the circuit board 90 folded in half. Although the circuit board 90 has been illustrated as employing a specific tab arrangement, those skilled in the art will readily appreciate that other tab arrangements employing the same or different numbers of tabs could also be utilized without departing from the scope or the spirit of the invention.

Those skilled in the art will further appreciate that, without departing from the scope or the spirit of the invention, the circuit board 90 can be configured with any arrangement of conductive paths suitable to form a desired lighting circuit. In the illustrated embodiment, the circuit board 90 is provided with three distinct conductive paths 92, 93, 94 as depicted in FIGS. 6 and 7. One end of conductive path 92 is coupled to switch contact 28. The other end of conductive path 92 is connected to lead wire 98 of lamp B as illustrated in FIG. 6. The second lead wire 99 of lamp B is connected to conductive path 93 on the circuit board 90 as shown in FIG. 7. Conductive path 93 is also connected to terminal 25 through conductive rivet 31. Thus, if terminal 25 is connected to a power source and terminal 23 is connected to ground (or vice versa), rocking the conductive bridge 34 into contact with switch contact 28 will form a series connection that permits current to flow between terminals 23 and 25 thereby energizing lamp B.

Similarly, one end of conductive path 94 is coupled to switch contact 30. The other end of that same conductive path 94 is connected to lead wire 96 of lamp A. Since lead wire 97 of lamp A is also connected to conductive path 93, rocking the conductive bridge 34 into contact with switch contact 30 will permit current flow between terminal 23 and 25 thereby energizing lamp A if terminals 23 and 25 are connected in circuit with a power source.

From the foregoing it can be seen that the electrical switch of the present invention can be efficiently and cost effectively manufactured. The circuit board 90 can be quickly riveted in position within the switch housing 21 by assembly personnel without expending time hand forming lamp lead wires to avoid interference with the moving parts of the switch 10. Moreover, since the circuit board 90 can be manufactured With many different arrangements of conductive paths without adding clutter to the switch housing 21, the need for the expensive external jumpers often encountered in prior art switches is avoided.

Although the invention has been described in connection with certain embodiments, it will be understood that there is no intent to in any way limit the invention to those embodiments. On the contrary, the intent is to cover all alternatives, modifications and equivalents included within the spirit and scope of the invention as defined by the appended claims.

We claim as our invention:

1. An electrical switch comprising:
   a housing having a wall;
   at least two terminals fixed to an outside face of the wall of the housing;
   at least two contacts defined on an inside face of the wall of the housing and electrically connected with respective ones of the terminals;
   a toggle lever pivotably supported within the housing, said toggle lever being pivotable between at least two positions, the toggle lever effecting an electrical connection in at least one of the at least two positions;
   a lamp disposed in the housing, said lamp having an off state and an on state and including a first lead for providing electrical current to the lamp when the lamp is in the on state;
   a circuit board comprising a substrate with a printed circuit thereon, said circuit board substrate being supported within said housing with said printed circuit defining a first conductive path electrically connecting the first lead of said lamp to at least one of the contacts.

2. An electrical switch as defined in claim 1 wherein the circuit board substrate is made of flexible material.

3. An electrical switch as defined in claim 2 in which said circuit board substrate is made of flat material and is folded into final configuration and supported within said housing.

4. An electrical switch as defined in claim 1 further comprising:

a conductive bridge; and, a bridge support electrically connected to one of the terminals and adapted to serve as a fulcrum supporting the conductive bridge for pivotal movement thereon between at least two operative positions, said conducting bridge being disposed in operative engagement with the toggle lever such that the conductive bridge pivots in response to movements of the toggle lever.

5. An electrical switch as defined in claim 1 wherein the toggle lever is coupled to a manually engageable button, at least a portion of said button being illuminated when the indicating lamp is in the on state.

6. An electrical switch as defined in claim 1 wherein the circuit board is disposed in a plane substantially perpendicular to said housing wall.

7. An electrical switch as defined in claim 6 wherein the toggle lever is pivotable within a plane substantially parallel to the plane of the circuit board.

8. An electrical switch as defined in claim 6 wherein the circuit board is substantially flat thereby avoiding interference with the movements of the toggle lever.

9. An electrical switch as defined in claim 6 wherein the circuit board includes a first tab and a second tab, the first and second tabs being disposed in a plane substantially parallel to said housing wall.

10. An electrical switch as defined in claim 9 wherein the at least two contacts comprise electrically conductive rivets which secure the first and second tabs of the circuit board to said housing wall.

11. An electrical switch as defined in claim 10 wherein the first conductive path connects one of the conductive rivets to the first lead wire of the lamp.

12. An electrical switch as defined in claim 11 wherein the lamp further comprises a second lead wire connected in series with the first lead wire, and said circuit board further comprises a second conductive path electrically connecting the second lead wire to a second one of the conductive rivets such that the first and second rivets, the first and second conductive paths of the circuit board, and the lamp form a series connection.

13. An electrical switch as defined in claim 12 wherein the circuit board is flexible.

14. An electrical switch as defined in claim 6 wherein said housing wall comprises a bottom wall of the housing.

15. An electrical switch as defined in claim 14 wherein the toggle lever is pivotable within a plane substantially parallel to the plane of the circuit board.

16. An electrical switch as defined in claim 14 wherein the circuit board is substantially flat thereby avoiding interference with the movements of the toggle lever.

17. An electrical switch as defined in claim 14 wherein the circuit board includes a first tab and a second tab, the first and second tabs being disposed in a plane substantially parallel to said housing wall.

18. An electrical switch as defined in claim 17 wherein the at least two contacts comprise electrically conductive rivets which secure the first and second tabs of the circuit board to said housing wall.

19. An electrical switch as defined in claim 18 wherein the first conductive path connects one of the conductive rivets to the first lead of the lamp.

20. An electrical switch as defined in claim 19 wherein the lamp further comprises a second lead connected in series with the first lead, and said circuit board substrate further has a second conductive path thereon electrically connecting the second lead to a second one of the conductive rivets such that the first and second rivets, the first and second conductive paths of the circuit board, and the lamp form a series connection.

21. An electrical switch as defined in claim 20 wherein the circuit board is flexible.

22. An electrical switch as defined in claim 1 in which said lamp has a second lead, and said printed circuit defines a second conductive path electrically connected to said second lead of said lamp.

23. An electrical switch as defined in claim 1 in which said first lead of said lamp includes a wire, and said circuit board is connected between said housing wall and said wire.

24. An electrical switch comprising:

a housing having a wall;

at least two terminals fixed to an outside face of the wall of the housing;

at least two contacts defined on an inside face of the wall of the housing and electrically connected with respective ones of the terminals;

a toggle lever pivotably supported within the housing, said toggle lever being pivotable between at least two positions, the toggle lever effecting an electrical connection in at least one of the at least two positions;

a lamp disposed in the housing, said lamp having an off state and an on state and including a first lead for providing electrical current to the lamp when the lamp is in the on state;

a circuit board connected between the first lead of said lamp and said housing wall, said circuit board being disposed in a plane substantially perpendicular to said housing wall and including first and second tabs disposed in a plane substantially parallel to said housing wall, and said circuit board including a first conductive path electrically connecting the first lead of the lamp to at least one of the contacts.

25. An electrical switch as defined in claim 24 in which said first lead of said lamp includes a wire, and said circuit board is connected between said housing wall and said wire.

* * * * *